US007052822B2

(12) United States Patent
Goto

(10) Patent No.: US 7,052,822 B2
(45) **Date of Patent: *May 30, 2006**

(54) PHOTOSENSITIVE COMPOSITION

(75) Inventor: Takahiro Goto, Shizuoka-ken (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 90 days.

This patent is subject to a terminal disclaimer.

(21) Appl. No.: 10/669,696

(22) Filed: Sep. 25, 2003

(65) Prior Publication Data

US 2004/0063034 A1 Apr. 1, 2004

(30) Foreign Application Priority Data

Sep. 30, 2002 (JP) ............................ 2002-287616

(51) Int. Cl.
*G03F 7/033* (2006.01)
*G03F 7/028* (2006.01)
*G03F 7/038* (2006.01)
*G03F 7/14* (2006.01)

(52) U.S. Cl. .............................. 430/283.1; 430/270.1; 430/281.1; 430/285.1; 430/286.1; 430/288.1; 430/302; 430/287.1; 430/964

(58) Field of Classification Search ............ 430/270.1, 430/281.1, 283.1, 286.1, 287.1, 288.1, 302, 430/285.1, 964
See application file for complete search history.

(56) References Cited

U.S. PATENT DOCUMENTS

| | | | | |
|---|---|---|---|---|
| 3,725,356 | A | 4/1973 | Luders et al. | |
| 3,804,631 | A | 4/1974 | Faust | |
| 3,839,171 | A | 10/1974 | Akamatsu et al. | |
| 3,930,865 | A | 1/1976 | Faust et al. | |
| 4,019,972 | A | 4/1977 | Faust | |
| 4,239,849 | A | 12/1980 | Lipson et al. | |
| 4,476,215 | A | 10/1984 | Kausch | |
| 4,499,163 | A | 2/1985 | Ishimaru et al. | |
| 4,510,227 | A | 4/1985 | Mohr et al. | |
| 4,537,855 | A | 8/1985 | Ide | |
| 4,687,727 | A | 8/1987 | Toyama et al. | |
| 4,772,538 | A | 9/1988 | Walls et al. | |
| 4,950,581 | A | 8/1990 | Koike et al. | |
| 4,952,478 | A | 8/1990 | Miyagawa et al. | |
| 5,080,999 | A | 1/1992 | Imai et al. | |
| 5,200,292 | A | 4/1993 | Shinozaki et al. | |
| 5,246,816 | A | 9/1993 | Yamashita et al. | |
| 5,340,699 | A | 8/1994 | Haley et al. | |
| 5,641,608 | A | 6/1997 | Grunwald et al. | |
| 5,705,322 | A | 1/1998 | West et al. | |
| 5,919,601 | A | 7/1999 | Nguyen et al. | |
| 5,952,154 | A | 9/1999 | Barr et al. | |
| 5,965,319 | A | 10/1999 | Kobayashi | |
| 6,013,412 | A | 1/2000 | Aoshima | |
| 6,030,750 | A | 2/2000 | Vermeersch et al. | |
| 6,309,792 | B1 | 10/2001 | Hauck et al. | |
| 6,399,689 | B1 | 6/2002 | Scarlette | |
| 6,423,462 | B1 | 7/2002 | Kunita | |
| 6,482,571 | B1 | 11/2002 | Teng | |
| 6,566,035 | B1 | 5/2003 | Aoshima | |
| 6,576,401 | B1 | 6/2003 | Teng | |
| 6,733,948 | B1 | 5/2004 | Nakamura et al. | |
| 6,794,116 | B1 | 9/2004 | Oshima | |
| 6,838,222 | B1 * | 1/2005 | Aoshima et al. | 430/176 |
| 6,861,200 | B1 | 3/2005 | Oshima | |
| 2001/0036598 | A1 | 11/2001 | Shimada et al. | |
| 2002/0051934 | A1 | 5/2002 | Nakamura et al. | |
| 2002/0055058 | A1 | 5/2002 | Sorori et al. | |
| 2002/0136987 | A1 | 9/2002 | Oshima | |
| 2002/0160295 | A1 | 10/2002 | Aoshima et al. | |
| 2002/0177074 | A1 | 11/2002 | Hoshi | |
| 2002/0182539 | A1 * | 12/2002 | Fujimaki et al. | 430/281.1 |
| 2002/0197564 | A1 | 12/2002 | Timpe et al. | |
| 2003/0008239 | A1 | 1/2003 | Fujimaki et al. | |
| 2003/0068575 | A1 | 4/2003 | Yanaka | |
| 2003/0073032 | A1 | 4/2003 | Aoshima et al. | |
| 2003/0082478 | A1 | 5/2003 | Itakura et al. | |
| 2003/0146965 | A1 * | 8/2003 | Fujimaki et al. | 347/105 |
| 2003/0162127 | A1 | 8/2003 | Kikuchi | |
| 2003/0186174 | A1 | 10/2003 | Nagase | |
| 2004/0068026 | A1 | 4/2004 | Kunita et al. | |
| 2004/0072101 | A1 * | 4/2004 | Sugasaki et al. | 430/281.1 |
| 2004/0131971 | A1 * | 7/2004 | Sugasaki et al. | 430/281.1 |
| 2004/0137369 | A1 * | 7/2004 | Shimada | 430/281.1 |

(Continued)

FOREIGN PATENT DOCUMENTS

| | | |
|---|---|---|
| CA | 1338095 | 2/1996 |

(Continued)

OTHER PUBLICATIONS

McGinniss, Vincent D., "Radiation Curing: 6. Curing with Ultraviolet, Visible and Infrared Processing Equipment" from Kirk-Othmer Encyclopedia of Chemical Technology, copyright 1996, by John Wiley & Sons, Inc., Article Online posting date Dec. 4, 2000.

(Continued)

*Primary Examiner*—Richard L. Schilling
(74) *Attorney, Agent, or Firm*—Sughrue Mion, PLLC

(57) ABSTRACT

The present invention provides an infrared photosensitive composition including a binder polymer (A), a polymerizable compound (B), an infrared absorber (C), and a compound (D) which can generate radicals by the action of light or heat, wherein an acid value of a film produced from the composition is from 0.15 mmol/g to 0.8 mmol/g. The invention also provides a planographic printing plate precursor including a substrate having disposed thereon a recording layer that contains the infrared photosensitive composition.

20 Claims, 4 Drawing Sheets

U.S. PATENT DOCUMENTS

| | | | | |
|---|---|---|---|---|
| 2004/0170920 | A1 | 9/2004 | Goto | |
| 2004/0170922 | A1 * | 9/2004 | Goto | 430/273.1 |
| 2004/0175648 | A1 * | 9/2004 | Goto | 430/270.1 |
| 2004/0202957 | A1 | 10/2004 | Murota | |
| 2004/0223042 | A1 * | 11/2004 | Goto | 347/118 |
| 2004/0234893 | A9 | 11/2004 | Fujimaki | |
| 2004/0244619 | A1 * | 12/2004 | Goto | 101/453 |
| 2005/0026082 | A1 * | 2/2005 | Shimada | 430/281.1 |
| 2005/0037282 | A1 | 2/2005 | Sonokawa | |

FOREIGN PATENT DOCUMENTS

| | | | |
|---|---|---|---|
| EP | 0 377 321 | | 7/1990 |
| EP | 0 684 522 | A1 | 11/1995 |
| EP | 0 779 161 | A1 | 6/1997 |
| EP | 0 950 518 | A1 | 1/1999 |
| EP | 0 919 870 | A1 | 6/1999 |
| EP | 0 950 517 | A1 | 10/1999 |
| EP | 1 033 624 | A1 | 9/2000 |
| EP | 1 096 315 | A1 * | 5/2001 |
| EP | 1 110 747 | A1 | 6/2001 |
| EP | 1 160 095 | A2 | 12/2001 |
| EP | 1 176 467 | A1 | 1/2002 |
| EP | 1 182 033 | A1 | 2/2002 |
| EP | 1182033 | * | 2/2002 |
| EP | 1 186 407 | A1 | 3/2002 |
| EP | 1 216 830 | A2 | 6/2002 |
| EP | 1 219 464 | A2 | 7/2002 |
| EP | 1 235 107 | A1 | 8/2002 |
| EP | 1 241 002 | A2 | 9/2002 |
| EP | 1 245 405 | A2 | 10/2002 |
| EP | 1 249 343 | A2 | 10/2002 |
| EP | 1 249 731 | A2 | 10/2002 |
| EP | 1 332 870 | A2 | 8/2003 |
| EP | 1 338 921 | A2 | 8/2003 |
| EP | 1 341 040 | A1 | 9/2003 |
| EP | 1369 231 | A2 | 12/2003 |
| EP | 1 400 851 | A2 | 3/2004 |
| EP | 1 449 650 | A2 | 8/2004 |
| EP | 1 450 207 | A1 | 8/2004 |
| GB | 1 521 372 | | 8/1978 |
| JP | 54-92723 | | 7/1979 |
| JP | 54-25957 | | 8/1979 |
| JP | 54-34327 | | 10/1979 |
| JP | 58 134629 | | 2/1982 |
| JP | 58-29803 | | 2/1983 |
| JP | 58-12577 | | 3/1983 |
| JP | 59-044615 | | 3/1984 |
| JP | 59 053836 | | 3/1984 |
| JP | 59-071048 | | 4/1984 |
| JP | 161442 | | 6/1990 |
| JP | 4 31863 | | 2/1992 |
| JP | 4 106548 | | 4/1992 |
| JP | 7-20629 | | 11/1994 |
| JP | 7-271029 | | 9/1995 |
| JP | 0806283 | | 3/1996 |
| JP | 8-108621 | | 4/1996 |
| JP | 9-43847 | A | 2/1997 |
| JP | 2712564 | | 10/1997 |
| JP | 10 195119 | | 7/1998 |
| JP | 11 258801 | | 9/1999 |
| JP | 2000 131837 | A | 5/2000 |
| JP | 2000-267265 | A | 9/2000 |
| JP | 2001-133969 | A | 5/2001 |
| JP | 2002-040652 | | 2/2002 |
| JP | 2002-072462 | | 3/2002 |
| WO | WO 0048836 | | 8/2000 |

OTHER PUBLICATIONS

SR-295, product bulletin, SARTOMER Company, Exton, PA, one page, dated Nov. 1998 from internet through Sartomer web site.

SR-399, Product bulletin, SARTOMER Company, Exton, PA., one page, dated Nov. 1998, from internet through Sartomer web site.

SR-492, product bulletin, SARTOMER Company, Exton, PA on page, dated Nov. 1998 from internet through Sartomer web site.

CD 501, product bulletin, SARTOMER Company, Exton, PA, one page, dated May 1999 from internet through Sartomer web site.

SR-368, product bulletin, SARTOMER Company, Exton, PA 1 pate, dated Nov. 1998, from internet through Sartomer web site.

Product Data, Scripset 550 Styreen Maleic Anhydride Copolymer Solid, Hercules Incorporated, copyright 1999, dated Jun. 2000 from internet.

European Search Report dated Jul. 2, 2002.

European Search Report dated Apr. 16, 2004.

European Search Report dated Jun. 14, 2005.

European Search Report dated Jan. 16, 2004.

Jerry March: "Advanced organic chemistry: reactions, mechanisms, and structure" 1992, Wiley-Interscient, $4^{th}$ Ed., USA, XP 002275533 p. 280, Table 9.4.

Ben-zyl from The American Heritage dictionary of the English Language, Fourth Edition, copyright 2000 by Houghton Mifflin Company found at yourdictionary.com, one page.

Mineo et al, 08062834, English Abstract of Japanese Published Application 08062834 dated Mar. 8, 1996, p. Patent Abstracts of Japan dated 1996.

Office Action dated Jan. 31, 2005 from U.S. Appl. No. 10/673,332.

Office Action dated Jan. 25, 2005 from U.S. Appl. No. 10/673,332.

Office Action dated Apr. 18, 2005 from U.S. Appl. No. 10/781,922.

Office Action dated Mar. 9, 2005 from U.S. Appl. No. 10/671,776.

Office Action dated Feb. 23, 2005 from U.S. Appl. No. 10/669,696.

Office Action dated Apr. 18, 2005 from U.S. Appl. No. 10/781,645.

Office Action dated Apr. 18, 2005 from U.S. Appl. No. 10/782,852.

Registry No. 2154-56-5, one page, "benzyl".

* cited by examiner

PHOTOSENSITIVE COMPOSITION

CROSS-REFERENCE TO RELATED APPLICATION

This application claims priority under 35 USC 119 from Japanese Patent Application No. 2002-287616, the disclosure of which is incorporated by reference herein.

BACKGROUND OF THE INVENTION

1. Field of the Invention

The present invention relates to a photopolymerizable composition that is curable by exposure with infrared rays. More specifically, the invention relates to an infrared photosensitive composition which is suitable as a recording layer for a negative-type planographic printing plate precursor.

2. Description of the Related Art

A variety of systems capable of making printing plates directly from digital data stored in computers have been developed. For example, a photopolymerization-type image recording material, which is exposed using a laser emitting blue or green visible rays or the like is attracting attention as a recording layer of a planographic printing plate, since such material is sensitive to an argon laser or the like and capable of high-sensitive direct plate making using photopolymerization initiation, and since high printing durability can be attained due to a toughness of the coated film cured by photopolymerization.

As a laser printing plate which utilizes a photopolymerization initiating system and is sensitive to a visible laser such as the argon laser, there is used, for example, a printing plate comprising an aluminum substrate having disposed thereon a layer of a photopolymerizable composition which contains an addition-polymerizable compound having an ethylenically unsaturated double bond and a photopolymerization initiator, and optionally contains an organic polymer binder, a thermal-polymerization inhibitor and other components, and an additional layer to block oxygen which hinders polymerization. The photopolymerizable planographic printing plate is image-exposed with a desired image and exposed areas are cured by polymerization, while non-exposed areas are removed (developed) with an aqueous alkali solution, whereby an image is obtained.

In recent years, development of lasers has been remarkable. In particular, solid lasers and semiconductor lasers, which emit infrared radiation in a wavelength range of 760 to 1200 nm, have high output power and are compact, have become readily available. These lasers are very useful as a recording light source when making the printing plates directly from digital data stored in computers or the like. Thus, in addition to a large number of photosensitive recording materials which are photosensitive to a visible light range below 760 nm, the aforementioned practically usable materials on which images can be recorded using such infrared lasers have been developed.

As recording materials which are selectively sensitive to infrared rays, there are known a positive-type image recording material which has increased solubility of exposed areas with an aqueous alkali solution, and a negative-type image recording material which has decreased solubility of exposed areas with an aqueous alkali solution due to curing of the exposed areas. As the positive-type image recording material, a recording material in which a phase-change of Novolack resin is utilized (see, e.g., Japanese Patent Application Laid-Open (JP-A) No. 9-43847) is known. However, this recording material is poor in scratch resistance and has a problem associated with handling properties. While, as the negative-type image recording material excellent in scratch resistance, an image recording material that has a recording layer comprising an infrared absorber, an onium salt and a polymerizable compound, and does not require preheating at the time of forming images has been disclosed (see, e.g., JP-A No. 2001-133969). When this technique is used, printing durability can be attained to some degree even if the material is not preheated. However, there is still a demand for improvement of stain prevention at non-imaged areas, and under the current circumstances, further enhanced printing durability is desired.

SUMMARY OF THE INVENTION

An object of the present invention is to provide an infrared photosensitive composition that is highly curable by an infrared laser, useful as a recording layer for a negative-type planographic printing plate precursor on which images can be recorded directly from digital data stored in a computer or the like, excellent in both printing durability and stain resistance at non-image areas when applied to planographic printing plate precursors, and can form high-quality images.

The present invention was accomplished by the following.

A first aspect of the invention is an infrared photosensitive composition which comprises a binder polymer (A), a polymerizable compound (B), an infrared absorber (C), and a compound (D) which can generate radicals by the action of light or heat, wherein an acid value of a film produced from the composition is from 0.15 mmol/g to 0.8 mmol/g.

A second aspect of the invention is a planographic printing plate precursor which comprises a substrate having disposed thereon a recording layer that contains an infrared photosensitive composition including: a binder polymer (A), a polymerizable compound (B), an infrared absorber (C), and a compound (D) which can generate radicals by the action of light or heat, wherein an acid value of a film produced from the composition is from 0.15 mmol/g to 0.8 mmol/g.

DETAILED DESCRIPTION OF THE INVENTION

Figure 1:
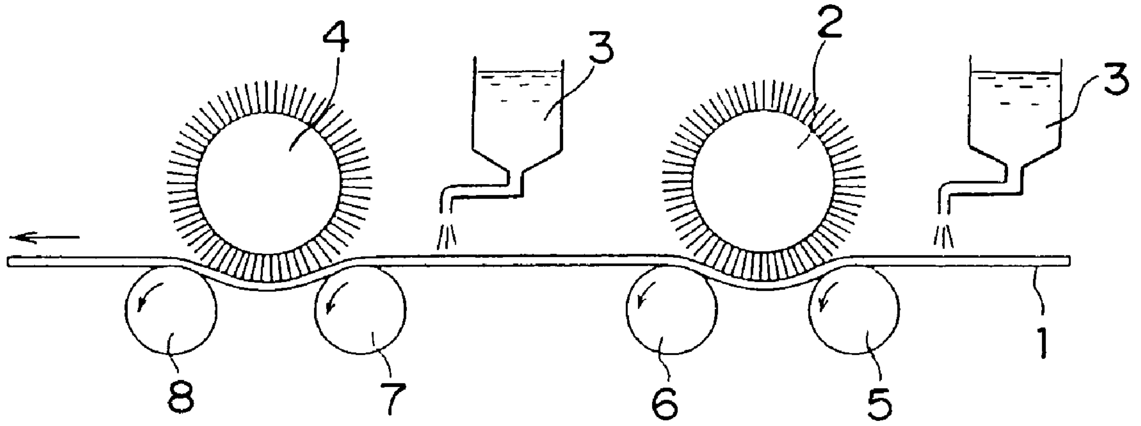
FIG. 1 is a side view illustrating a conception of a brush graining step used in mechanically surface-roughening treatment when forming a substrate of a planographic printing plate according to the invention.

The present invention will be described in more detail below.

The infrared photosensitive composition of the invention is suitably used for an image forming layer to be applied onto a substrate, and characterized in that an acid value of a film produced from the infrared photosensitive composition is from 0.15 mmol/g to 0.8 mmol/g.

The acid value of a film as used herein is calculated from the acid value of compounds having an acidic group and contained in the film, and refers to a value obtained by dividing "a sum of respective masses of the compounds having an acidic group multiplied by respective acid values thereof" by "a mass of solids present in the film". As the acid value of each of the compounds having an acidic group, a value determined by the following neutralization titration is adopted.

The method of neutralization titration will be described hereinafter. A mixture of 0.1 g of a compound which has an acidic group, 544 ml of MFG (1-methoxy-2-propanol) and 6 ml of water is subjected to neutralization titration in a burette, using a 0.1 N NaOH aqueous solution. The pH thereof is measured at 25° C. with a pH meter (HM-26S) manufactured by DKK-TOA Corporation. The acid value is obtained as the mol number of NaOH necessary for the neutralization of 1 g of the compound.

If the acid value of the film is less than 0.15 mmol/g, unsatisfactory development is easily caused. Thus, when the composition is used for image recording material, stains at non-image areas increase. On the other hand, if the acid value of the film is more than 0.8 mmol/g, the effect of irradiation with infrared rays falls. Thus, when the composition is used for image forming material, images cannot be formed or the printing durability thereof deteriorates. The acid value of the film is preferably 0.15 mmol/g or more and 0.6 mmol/g or less, more preferably 0.2 mmol/g or more and 0.5 mmol/g or less.

As described above, the acid value of the film as used herein depends on the compounds which have an acidic group and contained in the film. Accordingly, the acid value is determined by the content of the acid group of a binder polymer (A) and the content of the acid group of a polymerizable compound (B) present in the composition. Description will now be given of the binder polymer for use in the invention.

[A] Binder Polymer

In the infrared photosensitive composition of the invention, the binder polymer is used for improving coated film properties of the recording layer to be formed, and other purposes. It is preferred to use, as the binder, a linear organic polymer. The kind of the main chain of the linear organic polymer used in this case is not particularly limited. Preferred examples of the polymer having a main chain include polyurethane, polyamide, polyester, polyvinyl, polystyrene, poly(meth)acryl, and Novolak-type polymers. More preferred examples are polystyrene and poly(meth)acryl.

The binder polymer used in the invention is preferably a binder polymer having a radical polymerizable group. As the radical polymerizable group included in the binder polymer, any group having a radical-polymerizable unsaturated double bond can be used without any specific limitation.

Preferred examples of the radical polymerizable group which can be introduced include a-substituted methylacryl group [—OC(=O)—C(—$CH_2$Z)=$CH_2$, in which Z represents a hydrocarbon group having a terminal hetero atom], an acryl group, a methacryl group, an allyl group, and a styryl group. Particularly preferred are acryl and methacryl groups.

The content of the radical polymerizable group (i.e., the content of the radical polymerizable unsaturated double bonds determined by iodometric titration) in the binder polymer is preferably from 0.1 to 10.0 mmol, more preferably from 1.0 to 7.0 mmol, and most preferably from 2.0 to 5.0 mmol per gram of the polymer. If the content is less than 0.1 mmol, curability may decrease, leading to lowered sensitivity. If the content is more than 10.0 mmol, the binder itself may become unstable, leading to lowered storability of the composition.

As the binder polymer (A) for use in the invention, a linear organic polymer having an alkali soluble group may be used. The content (i.e., the acid value based on neutralization titration) of the alkali soluble group in the binder polymer is preferably from 0.1 to 3.0 mmol, more preferably from 0.2 to 2.0 mmol per gram of the polymer. If the content is less than 0.1 mmol, the binder may precipitate at the time of development, whereby scum readily occurs. If the content is more than 3.0 mmol, hydrophilicity of the resultant coated film increases, whereby printing durability tends to deteriorate.

As the alkali soluble group, any acidic group which is dissociated by alkali may be used without any specific limitation. The alkali soluble group is preferably a carboxylic acid group, and is more preferably a carboxylic acid group having a structure of the following formula (I).

Formula (I)

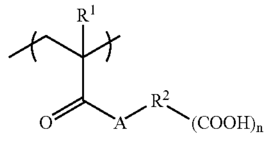

In formula (I), $R^1$ represents a hydrogen atom or a methyl group, and $R^2$ is a linking group having 4 to 30 atoms. The linking groups which are composed of atoms selected from carbon, hydrogen, oxygen, nitrogen, sulfur and halogen atoms may be used without any specific limitation. A plurality of carboxylic groups may be contained in the same unit. The number thereof is preferably an integer of 1 to 3 (n=1 to 3), more preferably 1 (n=1). A represents an oxygen atom or —N—$R^3$—, in which $R^3$ represents a hydrogen atom or a monovalent hydrocarbon group having 1 to 10 carbon atoms.

The weight average molecular weight of the binder polymer is preferably from 2,000 to 1,000,000, more preferably from 10,000 to 300,000, and most preferably from 20,000 to 200,000. If the molecular weight is less than 2,000, the coated film properties tend to decrease, whereby printing durability may deteriorate. If the molecular weight is more than 1,000,000, the binder polymer is insoluble in a coating solvent, whereby it becomes difficult to form a uniform coated film.

The glass transition point (Tg) of the binder polymer is preferably from 70 to 300° C., more preferably from 80 to 250° C., and most preferably from 90 to 200° C. If the glass transition point is lower than 70° C., storability falls, whereby printing durability tends to decrease. If the glass transition point is higher than 300° C., the radical mobility falls, whereby sensitivity tends to decrease.

The binder polymer preferably has an amide group or an imide group in order to raise the glass transition point. Particularly preferably, the binder polymer contains methacrylamide or a methacrylamide derivative.

Hereinafter, specific examples [(I-1) to (I-9)] of the binder polymer suitable for use in the invention will be listed. However, in the invention, the binder polymer is not limited to these examples.
I-1
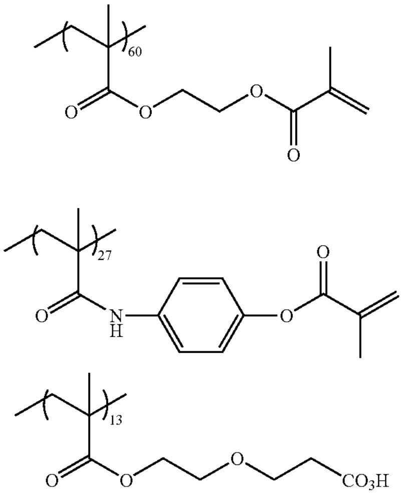
I-2
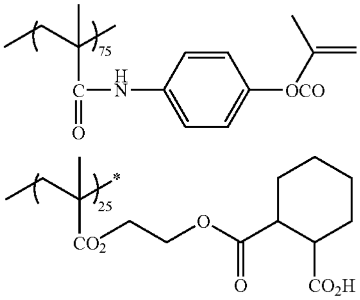
I-3
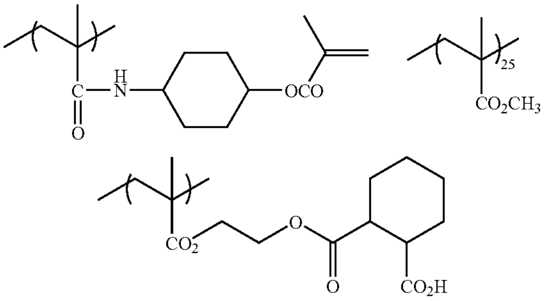
I-4
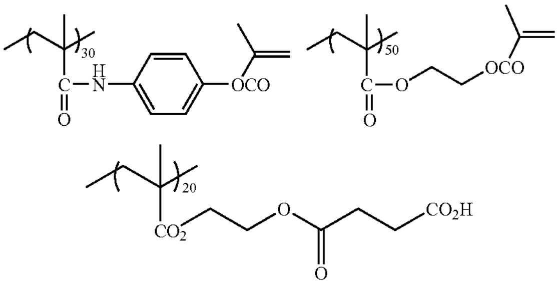
-continued
I-5
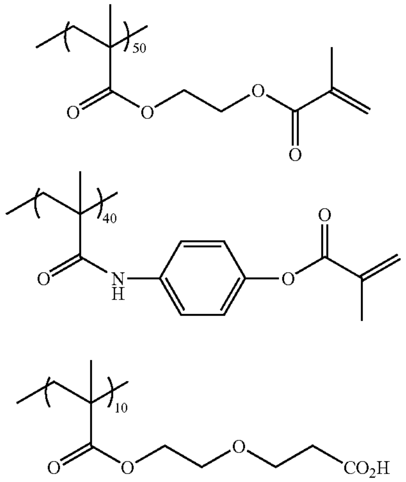
I-6
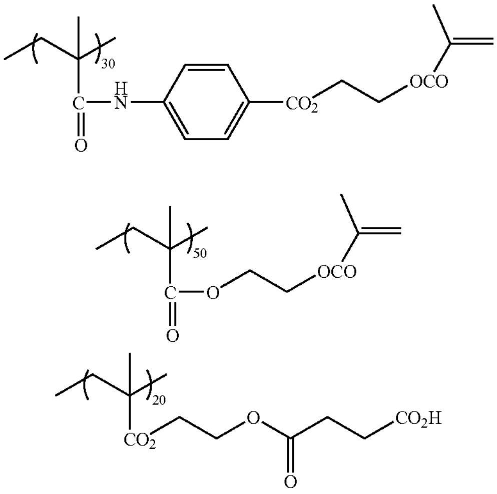
I-7
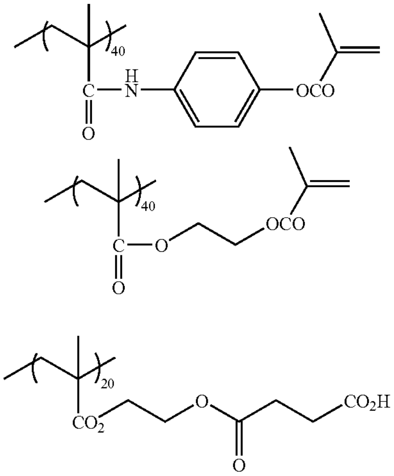
I-8
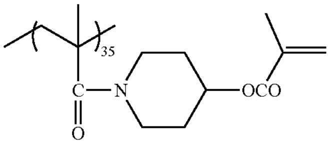

-continued

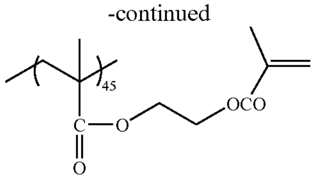

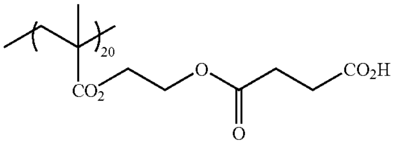

I-9

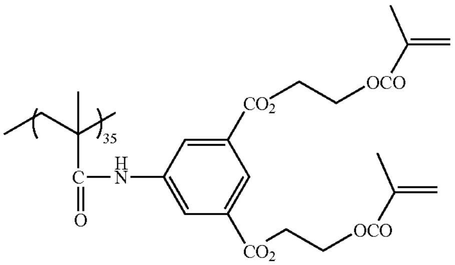

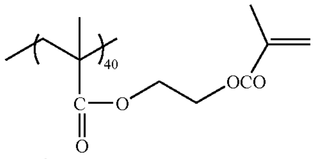

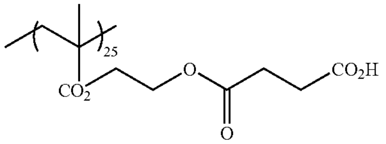

In the invention, the binder polymers may be used alone or in combination of two or more thereof. These polymers are added in an amount of 20 to 95%, preferably 30 to 90% by mass relative to total solid contents present in the photosensitive composition. If the added amount is less than 20% by mass, curability is poor. Thus, when the binder polymer is used in such an amount in the image forming material to form images, strength of image areas is insufficient. If the added amount is more than 95% by mass, curability also decreases, leading to no images formed.

The ratio of a compound having a radical polymerizable ethylenically unsaturated double bond, which is a component (B) to be described later, to the binder polymer (A), contained in the photosensitive composition of the invention, is preferably from 1/9 to 7/3, more preferably from 3/7 to 7/3, and most preferably from 4/6 to 6/4 (by weight).

The infrared photosensitive composition of the invention comprises a polymerizable compound (B), an infrared absorber (C), and a compound (D) which can generate radicals by the action of light or heat, in addition to the binder polymer (A). These components will be described hereinafter.

(B) Polymerizable Compound

The polymerizable compound used in the invention is a polymerizable compound having at least one ethylenically unsaturated double bond, and is selected from compounds having a terminal ethylenically unsaturated bond, preferably compounds having two or more terminal ethylenically unsaturated bonds. Such compounds are well known in the industrial field relating to the invention. In the invention, these compounds may be used without any specific limitation, and have various chemical structures, such as a monomer, a prepolymer (i.e., a dimer, a trimer, or an oligomer), or a mixture thereof, or a copolymer thereof. Examples of the monomer and the copolymer include unsaturated carboxylic acids (e.g., acrylic acid, methacrylic acid, itaconic acid, crotonic acid, isocrotonic acid, and maleic acid), esters thereof, and amides thereof. Preferred examples thereof include esters of an unsaturated carboxylic acid and an aliphatic polyhydric alcohol compound; amides of an unsaturated carboxylic acid and an aliphatic polyhydric amine compound; products resulting from addition reaction of an unsaturated carboxylic acid ester or amide having a nucleophilic substituent such as a hydroxyl group, an amino group or a mercapto group with a monofunctional or polyfunctional isocyanate or an epoxy; products resulting from dehydration condensation reaction of an unsaturated carboxylic acid ester or amide having a nucleophilic substituent with a monofunctional or polyfunctional carboxylic acid; products resulting from addition reaction of an unsaturated carboxylic acid ester or amide having an electrophilic substituent such as an isocyanate group or an epoxy group with a monofunctional or polyfunctional alcohol, amine or thiol; and products resulting from substitution reaction of an unsaturated carboxylic acid ester or amide having a leaving substituent such as a halogen group or a tosyloxy group with a monofunctional or polyfunctional alcohol, amine or thiol. Other examples thereof include compounds in which the above-mentioned unsaturated carboxylic acid is substituted with an unsaturated phosphonic acid, styrene or the like.

Specific examples of the polymerizable compound, such as acrylic ester, methacrylic ester, itaconic ester, crotonic ester, isocrotonic ester, and maleic ester, each of which is the ester of an aliphatic polyhydric alcohol compound and an unsaturated carboxylic acid, as described in paragraph Nos. [0037] to [0042] of JP-A No. 2001-133969, may be used in the invention.

Other preferred examples of the ester include aliphatic alcoholic esters described in Japanese Patent Application Publication (JP-B) Nos. 46-27926 and 51-47334, and JP-A No. 57-196231; esters having an aromatic skeleton described in JP-A Nos. 59-5240, 59-5241 and 2-226149; and esters having an amino group described in JP-A No. 1-165613.

Specific examples of the amide monomer of an aliphatic polyhydric amine compound and an unsaturated carboxylic acid include methylenebis-acrylamide, methylenebis-methacrylamide, 1,6-hexamethylenebis-acrylamide, 1,6-hexamethylenebis-methacrylamide, diethylenetriaminetrisacrylamide, xylylenebisacrylamide, and xylylenebismethacrylamide.

Other preferred examples of the amide monomer include monomers having a cyclohexylene structure as described in JP-B No. 54-21726.

Urethane-type addition-polymerizable compounds produced by addition reaction of isocyanate with a hydroxyl group are also preferred. Specific examples thereof include vinylurethane compounds having, in its molecule, two or more polymerizable vinyl groups, which are obtained by causing an addition-reaction of a vinyl monomer having a hydroxyl group and represented by the following formula (II) with a polyisocyanate compound having, in its molecule, two or more isocyanate groups, as described in JP-B No. 48-41708.

$$CH_2{=}C(R^{41})COOCH_2CH(R^{42})OH \quad \text{Formula (II)}$$

wherein $R^{41}$ and $R^{42}$ each independently represent H or $CH_3$.

Also Preferable are urethane acrylates as described in JP-A No. 51-37193, and JP-B Nos. 2-32293 and 2-16765, and urethane compounds having an ethylene oxide skeleton, as described in JP-B Nos. 58-49860, 56-17654, 62-39417 and 62-39418.

It is possible to use addition-polymerizable compounds each having, in its molecule, an amino structure or a sulfide structure, as described in JP-A Nos. 63-277653, 63-260909 and 1-105238.

Other examples thereof include polyfunctional acrylates and methacrylates such as polyester acrylates and epoxyacrylates resulting from reaction of an epoxy resin with (meth)acrylic acid, as described in JP-A No. 48-64183, and JP-B Nos. 49-43191 and 52-30490; specific unsaturated compounds described in JP-B Nos. 46-43946, 1-40337 and 1-40336; and vinylphosphonic acid type compounds described in JP-A No. 2-25493. In some case, it is preferred to use a structure containing a perfluoroalkyl group described in JP-A No. 61-22048. There may also be used compounds referred to as photo-curable monomers and oligomers described in the *Journal of the Adhesion Society of Japan*, Vol. 20, No. 7, pp.300–308 (1984).

In the case where the used polymerizable compound has, in its molecule, an acidic group, it should also be noted that the molar fraction of the acidic group contained therein is a factor for determining the acid value of the film produced from the photosensitive composition.

Details of how to use these polymerizable compounds (e.g., their structures, single use or combination use of two or more compounds selected therefrom, and adding amount) may arbitrarily be specified in accordance with the design of final performance of the photosensitive composition. For example, the using manner is selected from the following viewpoints. From the viewpoint of sensitivity of the photosensitive composition, a structure having a large amount of unsaturated groups per molecule is preferred. In many cases, a polymerizable compound in which the number of unsaturated functional groups per molecule is two or more is preferred. When the photosensitive composition is used as an image forming material, a polymerizable compound in which the number of unsaturated functional groups per molecule is three or more is preferred in order to improve strength of image areas, that is, a cured film. Also effectively employable is a method of combining compounds having different functional group numbers or different polymerizable groups (e.g., an acrylic ester type compound, a methacrylic ester type compound, and a styrene type compound) so as to adjust both of photosensitivity and strength of the film. Compounds having a large molecular weight or compounds having a high hydrophobicity are superior in sensitivity and strength of the film, but in some case they are not preferred from the viewpoints of developing speed and precipitation thereof in developer. The selection and the using manner of the radical polymerizable compound(s) are important factors in view of compatibility with other components (e.g., the binder polymer, an initiator, and a coloring agent) contained in the recording layer, and dispersibility thereof in other components. For example, using a low-purity compound or using two or more compounds in combination, compatibility may be improved. In order to improve adhesion of the recording layer to a substrate, an overcoat layer or some other layer, a specific structure may be obtained. If the proportion of the radical polymerizable compound in the image recording layer is larger, sensitivity is better. However, if the proportion is too large, the following problems may occur: unpreferable phase separation is generated; due to adhesiveness or stickiness of the image recording layer, troubles in the production process (e.g., insufficient production due to transferring of components in the recording layer or stickiness) are caused; and the radical polymerizable compound is precipitated from the developer. From these viewpoints, in many cases a preferred proportion of the polymerizable compounds is from 5 to 80% by mass, preferably from 20 to 75% by mass, relative to total components in the composition. These may be used alone or in combination of two or more thereof.

Besides, when using the polymerizable compound, an appropriate structure, blending and adding amount thereof may arbitrarily be selected from the viewpoints of the degree of polymerization inhibition due to oxygen, resolution, fogging property, change of refraction index, surface stickiness and so on. If desired, a layer structure or a coating method involving undercoating or overcoating, may be employed.

(C) Infrared Absorber

A main object of the invention is to apply the photosensitive composition for forming the recording layer of the image recording material so that images can be recorded by means of a laser that emits infrared radiation. It is therefore essential to use an infrared absorber in the photosensitive composition of the invention. The infrared absorber used in the invention is a dye or a pigment having an absorption maximum in a range of from 760 to 1,200 nm.

As the dye, there may be used commercially available dyes and conventionally known dyes described in "Dye Handbook" (edited by the Society of Synthetic Organic Chemistry, Japan and published in 1970) or other literatures. Specific examples of the dye include azo dyes, metal complex salt azo dyes, pyrazolone azo dyes, naphthoquinone dyes, anthraquinone dyes, phthalocyanine dyes, carbonium dyes, quinoneimine dyes, methine dyes, cyanine dyes, squarylium dyes, pyrylium salts, and metal thiolate complex dyes.

Preferred examples of the dye include cyanine dyes described in JP-A Nos. 58-125246, 59-84356, 59-202829, and 60-78787; methine dyes described in JP-A Nos. 58-173696, 58-181690 and 58-194595; naphthoquinone dyes described in JP-A Nos. 58-112793, 58-224793, 59-48187, 59-73996, 60-52940 and 60-63744; squarylium dyes described in JP-A No. 58-112792; and cyanine dyes described in GB Patent No. 434,875.

Moreover, the following are preferably used: near infrared absorbing sensitizers described in U.S. Pat. No. 5,156,938; substituted arylbenzo(thio)pyrylium salts described in U.S. Pat. No. 3,881,924; trimethinethiapyrylium salts described in JP-A No. 57-142645 (U.S. Pat. No. 4,327,169); pyrylium type compounds described in JP-A Nos. 58-181051, 58-220143, 59-41363, 59-84248, 59-84249, 59-146063 and 59-146061; cyanine dyes described in JP-A No. 59-216146; pentamethinethiopyrylium salts described in U.S. Pat. No. 4,283,475; and pyrylium compounds described in JP-B Nos. 5-13514 and 5-19702.

Other preferred examples of the dye include near infrared absorbing dyes represented by formula (I) or (II) in U.S. Pat. No. 4,756,993.

Among these dyes, particularly preferred are cyanine dyes, squarylium dyes, pyrylium salts, and nickel thiolate complexes. Cyanine dyes represented by the following formula (III) are most preferred:

Formula (III)

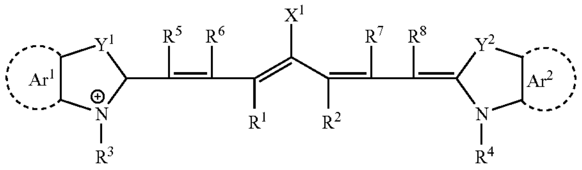

In formula (III), $X^1$ represents a halogen atom; $X^2$-$L^1$ or $NL^2L^3$, in which $X^2$ represents an oxygen atom or a sulfur atom; $L^1$ represents a hydrocarbon group having 1 to 12 carbon atoms; and $L^2$ and $L^3$ each independently represent a hydrocarbon group having 1 to 12 carbon atoms; and $R^1$ and $R^2$ each independently represent a hydrocarbon group having 1 to 12 carbon atoms. From the viewpoint of storability of a coating solution for the recording layer, it is preferred that $R^1$ and $R^2$ are each a hydrocarbon group having 2 or more carbon atoms, and it is particularly preferred that $R^1$ and $R^2$ are bonded to each other to form a 5-membered or 6-membered ring.

$Ar^1$ and $Ar^2$, which may be the same or different, represent aromatic hydrocarbon groups which may have a substituent. Preferred examples of the aromatic hydrocarbon group include a benzene ring and a naphthalene ring. Preferred examples of the substituent include hydrocarbon groups having 12 or less carbon atoms, halogen atoms, and alkoxy groups having 12 or less carbon atoms.

$Y^1$ and $Y^2$, which may be the same or different, represent sulfur atoms, or dialkylmethylene groups having 12 or less carbon atoms. $R^3$ and $R^4$, which may be the same or different, represent hydrocarbon groups which have 20 or less carbon atoms or may have a substituent. Preferred examples of the substituent include an alkoxy group having 12 or less carbon atoms, a carboxyl group, and a sulfo group. $R^5$, $R^6$, $R^7$ and $R^8$, which may be the same or different, represent hydrogen atoms or hydrocarbon groups having 12 or less carbon atoms, and preferably represent hydrogen atoms from the viewpoint of readily availability of starting materials. $Z^{1-}$ represents an counter anion. However, when any hydrogen in $R^1$ to $R^8$ is substituted with a sulfo group, $Z^{1-}$ is unnecessary. Preferred examples of $Z^{1-}$ include a halogen ion, a perchloric acid ion, a tetrafluoroborate ion, a hexafluorophosphate ion, and a sulfonic acid ion from the viewpoint of storability of the coating solution for the recording layer. Particularly preferred examples thereof include a perchloric acid ion, a hexafluorophosphate ion, and an arylsulfonic acid ion.

Specific examples of the cyanine dye represented by formula (III), which may preferably be used in the invention, include dyes described in paragraph Nos. [0017] to [0019] of JP-A No. 2001-133969.

As the pigment for use in the invention, there may be used commercially available pigments and pigments described in "Color Index (C.I.) Handbook", "Newest Pigment Handbook" (edited by the Society of Pigment Technique of Japan and published in 1977), "Newest Pigment Application Technique" (published by CMC Publishing Co., Ltd. in 1986) and "Printing Ink Technique" (published by CMC Publishing Co., Ltd. in 1984).

Examples of the species of the pigment include black pigment, yellow pigment, orange pigment, brown pigment, red pigment, purple pigment, blue pigment, green pigment, fluorescent pigment, metal powder pigment, and polymer bonded dyes. Specific examples thereof include insoluble azo pigments, azo lake pigments, condensed azo pigments, chelate azo pigments, phthalocyanine pigments, anthraquinone pigments, perylene pigments, perynone pigments, thioindigo pigments, quinacridon pigments, dioxazine pigments, isoindolinone pigments, quinophthalone pigments, dyeing lake pigments, azine pigments, nitroso pigments, nitro pigments, natural pigments, fluorescent pigments, inorganic pigments, and carbon black. Among these pigments, carbon black is preferred.

These pigments may be used with or without being subjected to surface treatment. Examples of a method for the surface treatment include a method of coating the pigment surface with resin or wax, a method of adhering a surfactant to the pigment surface, and a method of binding a reactive material (e.g., a silane coupling agent, an epoxy compound, or polyisocyanate) to the pigment surface. These surface treatment methods are described in "Nature and Application of Metal Soap" (Saiwai Shobo Co., Ltd.), "Printing Ink Technique" (published by CMC Publishing Co., Ltd. in 1984), and "Newest Pigment Application Technique" (published by CMC Publishing Co., Ltd. in 1986).

The particle size of the pigment is preferably from 0.01 to 10 μm, more preferably from 0.05 to 1 μm, and most preferably from 0.1 to 1 μm. If the particle size of the pigment is less than 0.01 μm, stability of the dispersed pigment in the coating solution for the image photosensitive layer is low. If the particle size is more than 10 μm, uniformity of the resultant image photosensitive layer is poor.

As a method for dispersing the pigment, a conventionally known dispersing technique used in the production of ink, toner or the like may be used. Examples of a dispersing machine used in the method include an ultrasonic disperser, a sand mill, an attriter, a pearl mill, a super mill, a ball mill, an impeller, a disperser, a KD mill, a colloid mill, a dynatron, a three-roll mill, and a pressuring kneader. Details thereof are described in "Newest Pigment Application Technique" (published by CMC Publishing Co., Ltd. in 1986).

When the photosensitive composition of the invention is used for a recording layer of an image recording material, the infrared absorber may be added to the same layer as contains other components or may be added to a separately-formed layer. When this is formed as a photosensitive layer of a negative-type planographic printing plate precursor, it is preferred that the optical density of the absorption maximum of the photosensitive layer in the wavelength range of from 760 to 1,200 nm is from 0.1 to 3.0. If the optical density is outside this range, sensitivity tends to decrease. Since the optical density depends on the addition amount of the infrared absorber and the thickness of the recording layer, a desired optical density may be obtained by controlling these two factors. The optical density of the recording layer may be measured by a usual method. Examples of the usual measuring method include a method of forming, onto a transparent or white substrate, a recording layer having a thickness which falls within such a range that the amount of the applied layer after being dried is a value necessary for the planographic printing plate to be produced, and then measuring the optical density of the recording layer using a transmission-type optical densitometry, and a method of forming a recording layer onto a reflecting substrate made of aluminum or the like, and then measuring the reflection density thereof.

(D) Compound which Generates Radicals by Action of Light or Heat

A compound which generates radicals and is preferably used in the invention may be an onium salt. Specific examples thereof include iodonium salts, diazonium salts and sulfonium salts. These onium salts also have a function as an acid generator. However, when the onium salt is used together with the radical polymerizable compound (B), the onium salt functions as a radical polymerization initiator. The onium salt preferably for use in the invention is an onium salt represented by the following formulae (IV) to (VI):

$$Ar^{11}—I^{\oplus}—Ar^{12}\ Z^{11\ominus} \quad (IV)$$

$$Ar^{21}—N^{\oplus}\equiv N\ Z^{21\ominus} \quad (V)$$

(VI)

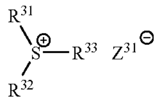

In formula (IV), $Ar^{11}$ and $Ar^{12}$ each independently represent an aryl group which has 20 or less carbon atoms and may have a substituent. In the case where this aryl group has a substituent, preferred examples of the substituent include a halogen atom, a nitro group, an alkyl group having 12 or less carbon atoms, an alkoxy group having 12 or less carbon atoms, and an aryloxy group having 12 or less carbon atoms. $Z^{11-}$ represents a counter ion selected from the group consisting of a halogen ion, a perchloric acid ion, a tetrafluoroborate ion, a hexafluorophosphate ion and a sulfonic acid ion, with a perchloric acid ion, a hexafluorophosphate ion, or an arylsulfonic acid ion being preferable.

In formula (V), $Ar^{21}$ represents an aryl group which has 20 or less carbon atoms and may have a substituent. Preferred examples of the substituent include halogen atoms, a nitro group, an alkyl group having 12 or less carbon atoms, an alkoxy group having 12 or less carbon atoms, an aryloxy group having 12 or less carbon atoms, an alkylamino group having 12 or less carbon atoms, a dialkylamino group having 12 or less carbon atoms, an arylamino group having 12 or less carbon atoms, and a diarylamino group having 12 or less carbon atoms. $Z^{21-}$ represents the same counter ions as defined for $Z^{11-}$.

In formula (VI), $R^{31}$, $R^{32}$ and $R^{33}$, which may be the same or different, represent hydrocarbon groups which have 20 or less carbon atoms and may have a substituent. Preferred examples of the substituent include halogen atoms, a nitro group, an alkyl group having 12 or less carbon atoms, an alkoxy group having 12 or less carbon atoms, and an aryloxy group having 12 or less carbon atoms. $Z^{31-}$ represents the same counter ions as defined for $Z^{11-}$.

Specific examples of the onium salt which may be preferably used in the invention include onium salts described in paragraph Nos. [0030] to [0033] of JP-A No. 2001-133969 (Japanese Patent Application No. 11-310623).

The onium salt used in the invention preferably has a maximum absorption wavelength of 400 nm or less, and more preferably has a maximum absorption wavelength of 360 nm or less. By regulating its absorption wavelength in an ultraviolet region, the planographic printing plate precursor may be handled under white light.

In the invention, the onium salt for use as a radical generator may be added in a proportion of 0.1 to 50%, preferably 0.5 to 30%, and most preferably 1 to 20% by mass, relative to total solid contents in the photosensitive composition. If the proportion of the onium salt is less than 0.1% by mass, sensitivity is lowered. If the proportion is more than 50% by mass, stains occur at non-image areas when the produced planographic printing plate is used for printing images. These onium salts may be used alone or in combination of two or more thereof. These onium salts may be added to the same layer that contains other components or may be added to a separately-formed layer.

A triazine compound may be used as a radical generator (radical polymerization initiator). In this case, radicals are generated by electron transfer from the infrared absorber which has absorbed infrared rays. Preferred examples of the triazine compound used in the invention are the compounds described in JP-A No. 4-122935. The adding amount thereof is preferably from about 0.5 to 30% by mass of the photosensitive composition.

Other Components

If necessary, various compounds other than the above-mentioned components may be added to the photosensitive composition of the invention. When this photosensitive composition is used for producing the image recording material, a dye exhibiting a large absorption within the visible range may be employed as an image coloring agent. Specific examples of the dye include Oil Yellow #101, Oil Yellow #103, Oil Pink #312, Oil Green BG, Oil Blue BOS, Oil Blue #603, Oil Black BY, Oil Black BS, and Oil Black T-505 (all manufactured by Orient Chemical Industries Ltd.); Victoria Pure Blue, Crystal Violet (CI42555), Methyl Violet (CI42535), Ethyl Violet, Rohdamine B (CI145170B), Malachite Green (CI42000), and Methylene Blue (CI52015); and dyes described in JP-A No. 62-29324. Pigments such as phthalocyanine-type pigments, azo-type pigments, carbon black and titanium oxide may suitably be used.

When these coloring agents are used for producing image recording materials, the agents are useful to readily distinguish between image areas and non-image areas after images are formed. The adding amount thereof is from 0.01 to 10% by mass relative to total solid contents in the composition.

In order to prevent unnecessary thermal polymerization of the radical polymerizable compound that has an ethylenically unsaturated double bond from occurring during preparation or storage of the photosensitive composition of the invention, it is desirable to add a small amount of a thermal polymerization inhibitor to the composition. Suitable examples of the thermal polymerization inhibitor include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), and a primary cerium salt of N-nitrosophenylhydroxyamine. The adding amount of the thermal polymerization inhibitor is preferably from about 0.01 to 5% by mass of the total mass of the composition. If necessary, in order to prevent polymerization inhibition due to oxygen, it is possible to add a higher aliphatic acid derivative such as behenic acid or behenic amide to the composition and, in the step of drying the applied composition, such that the derivative can be uniformly distributed on the surface of the photosensitive layer. The adding amount of the higher aliphatic acid derivative is preferably from about 0.1 to 10% by mass, relative to the total mass of the composition.

In order to increase processing stability against a change in developing conditions, it is possible to add, to the coating solution for the photosensitive layer, a nonionic surfactant as described in JP-A Nos. 62-251740 and 3-208514 or an amphoteric surfactant as described in JP-A Nos. 59-121044 and 4-13149.

Specific examples of the nonionic surfactant include sorbitan tristearate, sorbitan monopalmitate, sorbitan trioleate, monoglyceride stearate, and polyoxyethylene nonyl phenyl ether.

Specific examples of the amphoteric surfactant include alkyldi(aminoethyl)glycine, alkylpolyaminoethylglycine hydrochloride, 2-alkyl-N-carboxyethyl-N-hydroxyethylimidazolinium betaine, and N-tetradecyl-N,N-betaine types (for example, Amorgen K (trade name), manufactured by Daiichi Industrial Co., Ltd.).

The ratio of the above-mentioned nonionic surfactant and the amphoteric surfactant in the coating solution for the photosensitive layer is preferably from 0.05 to 15% by mass, more preferably from 0.1 to 5% by mass.

Besides, additives such as an adhesion improver, a development improver, an ultraviolet absorber or a lubricant may be incorporated into the coating solution for the photosensitive layer in accordance with purposes.

If necessary, a plasticizer may be added to the coating solution for the photosensitive layer in order to impart flexibility or the like to the coated film. The plasticizer may be, for example, polyethylene glycol, tributyl citrate, diethyl phthalate, dibutyl phthalate, dihexyl phthalate, dioctyl phthalate, tricresyl phosphate, tributyl phosphate, trioctyl phosphate, and tetrahydrofurfuryl oleate.

In order to produce a planographic printing plate precursor using the photosensitive composition of the invention, it is general to dissolve the above-mentioned respective components to constitute the coating solution for the photosensitive layer in a solvent and then apply the solution onto a suitable substrate. Examples of the usable solvent include ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetoamide, N,N-dimethylformamide, tetramethylurea, N-methylpyrrolidone, dimethylsulfoxide, sulfolane, γ-butyrolactone, toluene and water. However, the solvent is not limited thereto. These solvents may be used alone or in a mixture form. The concentration of the above-mentioned respective components (total solid contents including the additives) in the solvent is preferably from 1 to 50% by mass.

The applied amount (solid contents) of the photosensitive layer, which is applied onto the substrate and dried, varies depending on the use purposes of the layer. In the case where the layer is used in a planographic printing plate precursor, the amount is preferably from 0.5 to 5.0 g/$m^2$. As the applied amount is smaller, the apparent density is larger, however, the coated film property of the photosensitive layer, which functions as the image recording layer, is lowered.

As the method for applying the coating solution for the photosensitive layer, a variety of methods may be used. Examples thereof include bar coating, rotation coating, spray coating, curtain coating, dip coating, air-knife coating, blade coating and roll coating.

It is possible to add, to the coating solution for the photosensitive layer, a surfactant for improving the coating ability thereof, for example, a fluorine-type surfactant as described in JP-A No. 62-170950. The adding amount thereof is preferably from 0.01 to 1%, and more preferably from 0.05 to 0.5% by mass, relative to total solid contents in the photosensitive layer.

Substrate

A negative-type image recording material prepared using the photosensitive composition of the invention can be formed by applying the above-mentioned photosensitive layer onto a substrate. As the substrate, any plate that is dimensionally stable may be used without any specific limitation. Examples thereof include papers, plastic (e.g., polyethylene, polypropylene or polystyrene)-laminated papers, metal plates (e.g. aluminum, zinc and copper plates), plastic films (e.g., cellulose biacetate, cellulose triacetate, cellulose propionate, cellulose lactate, cellulose acetate lactate, cellulose nitrate, polyethylene terephthalate, polyethylene, polystyrene, polypropylene, polycarbonate, and polyvinyl acetate films), and papers or plastic films on which the above-described metal is laminated or vapor-deposited. The substrate is preferably a polyester film or an aluminum plate.

In the case where an image recording material prepared using the photosensitive composition of the invention is used as a planographic printing plate precursor, the substrate to be used is preferably an aluminum plate, which is light-weight and suitable for surface-treatment, good in workability and corrosion resistance. Examples of aluminum material used for this purpose include JIS 1050 material, JIS 1100 material, JIS 1070 material, Al—Mg based alloy, Al—Mn based alloy, Al—Mn—Mg based alloy, Al—Zr based alloy, and Al—Mg—Si based alloy.

Preferred examples of the aluminum plate include a pure aluminum plate and alloy plates made of aluminum as the main component and a minute amount of foreign elements. A plastic film on which aluminum is laminated or vapor-deposited may be used. The foreign elements contained in the aluminum alloys are silicon, iron, manganese, copper, magnesium, chromium, zinc, bismuth, titanium and so on. The content of the foreign elements in the alloy is 10% or less by mass. A particularly preferred example of the aluminum plate is a pure aluminum plate; however, a minute amount of the foreign elements may be contained in the plate since completely pure aluminum cannot be easily produced from the viewpoint of refining technique. Thus, the composition of the aluminum plate may not be particularly specified, since the conventionally known and used aluminum plates may be appropriately used.

The thickness of the aluminum plate is from about 0.1 to 0.6 mm, preferably from 0.15 to 0.4 mm, and most preferably from 0.2 to 0.3 mm.

If necessary, the aluminum plate may be subjected to surface treatment such as surface-roughening. Before the aluminum plate is surface-roughened, the plate is subjected to degreasing treatment with a surfactant, an organic solvent, an aqueous alkali solution or the like, so as to remove rolling oil on the surface. Thereafter, the aluminum is surface-roughened by various methods, for example, a mechanically surface-roughening method, a method of dissolving and roughening the surface electrochemically, or a method of dissolving the surface selectively in a chemical manner. The mechanically surface-roughening method may be a known method, such as a ball grinding method, brush grinding method, a blast grinding method or a buff grinding method. The electrochemically surface-roughening method may be a surface-roughening method conducted in a hydrochloric acid or nitric acid electrolyte by applying an alternating current or a direct current.

The thus surface-roughened aluminum plate is subjected to alkali-etching treatment and neutralizing treatment, as necessary. Thereafter, the aluminum plate is subjected to anodizing treatment if desired, in order to improve water retention characteristics or wear resistance of the surface. The amount of the anodic oxidation film resulting from the anodizing treatment is preferably 1.0 $g/m^2$ or more. In the case where the amount of the anodic oxidation film is less than 1.0 $g/m^2$, printing durability is insufficient. If the aluminum plate is used as a planographic printing plate, non-image areas are likely to suffer scratches, whereby a so-called "stain due to scratch", resulting from ink adhesion to scratched portions at the time of printing, readily occurs. After the anodizing treatment is conducted, the surface of the aluminum is subjected to hydrophilization, as necessary.

Such an aluminum substrate, after the anodizing treatment, may be subjected to treatment with an organic acid or a salt thereof, or application of an undercoat for the photosensitive layer.

An intermediate layer may be formed in order to improve close adhesion between the substrate and the photosensitive layer. For improvement in close adhesion, the intermediate layer usually contains a diazo compound, a phosphoric acid compound which is adsorbed to aluminum, or some other compound. The thickness of the intermediate layer is arbitrarily specified but should fall within a range in that when the intermediate layer is exposed to light, the intermediate layer can cause a uniform bond-forming reaction with the overlying photosensitive layer. Usually, the amount of the applied intermediate layer is preferably from about 1 to 100 $mg/m^2$, and more preferably from 5 to 40 $mg/m^2$ in terms of solid contents. The ratio of the diazo resin used in the intermediate layer is from 30 to 100%, and preferably from 60 to 100%.

After the surface of the substrate is subjected to the above-mentioned treatment or undercoated, a back coat is formed on the back face of the substrate, as necessary. It is preferred to use, as the back coat, a coated film made of a metal oxide obtained by hydrolyzing and polycondensing an organic polymer compound described in JP-A No. 5-45885 or an organic or inorganic metal compound described in JP-A No. 6-35174.

The central line average roughness of the substrate for a planographic printing plate is preferably from 0.10 to 1.2 μm. If the roughness is less than 0.10 μm, close adhesion of the substrate to the photosensitive layer may be lowered, whereby printing durability decreases significantly. If the roughness is more than 1.2 μm, stain resistance at the time of printing deteriorates. With respect to color density of the substrate, the reflection density value thereof is from 0.15 to 0.65. If the value is less than 0.15, halation generated at imagewise exposure is large enough to impair image formation. If the value is more than 0.65, an image is difficult to inspect during plate-examining work after the image is developed, leading to seriously lowered states of the plates for examination.

As described above, the photosensitive layer, and optionally other layers (e.g., the surface protective layer and the back coat layer) are formed on the substrate which had undergone the aforementioned treatments, and as a result, a planographic printing plate precursor having a negative-type image recording layer (hereinafter occasionally referred to as a "photosensitive layer") can be obtained using the photosensitive composition of the invention. An image may be recorded on this planographic printing plate precursor according to the invention using an infrared laser, or may be thermally recorded thereon using an ultraviolet lamp or a thermal head.

In the invention, it is preferred to imagewise expose the planographic printing plate precursor by means of a solid laser or a semiconductor laser which emits infrared rays having a wavelength of 760 to 1,200 nm. The output power of the laser is preferably 100 mW or more. In order to shorten the exposure time, it is preferred to use a multi-beam laser device. The exposure time per pixel is preferably 20 microseconds or less. The energy radiated onto the recording material is preferably from 10 to 300 $mJ/cm^2$. If the exposure energy is too low, curing of the image recording layer does not progress sufficiently. Thus, the insolubility ratio defined in the invention may not be attained. If the exposure energy is too high, the image recording layer suffers laser ablation, whereby formed images may be damaged.

The exposure may be performed using a light beam from a light source in an overlapping state. The term "overlapping" means that the pitch width in the vertical scanning direction is smaller than the diameter of the beam. For example, when the beam diameter is expressed by the half band width (FWHM) of the beam intensity, the overlapping can be quantitatively represented by the FWHM/the vertical scanning pitch width (=the overlapping coefficient). In the invention, the overlapping coefficient is preferably 0.1 or more.

The scanning manner of the light source for exposure used in the invention is not particularly limited. For example, a cylinder outside-surface scanning manner, a cylinder inside-surface scanning, a flat-surface scanning or the like may be used. The channel of the light source may be a mono-channel or multi-channel form. In the case of the cylinder outside-surface scanning, the channel thereof is preferably a multi-channel form.

The developer or the replenisher used in development or plate-making of a planographic printing plate, to which the image recording material according to the invention is applied, may be a conventionally known aqueous alkali solution.

Examples of the usable alkali include inorganic alkali salts such as sodium silicate, potassium silicate, sodium triphosphate, potassium triphosphate, ammonium triphosphate, sodium diphosphate, potassium diphosphate, ammonium diphosphate, sodium carbonate, potassium carbonate, ammonium carbonate, sodium hydrogencarbonate, potassium hydrogencarbonate, ammonium hydrogencarbonate, sodium borate, potassium borate, ammonium borate, sodium hydroxide, ammonium hydroxide, potassium hydroxide and lithium hydroxide; and organic alkali agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanoamine, monoisopropanolamine, diisopropanolamine, ethyleneimine, ethylenediamine and pyridine. These alkali agents may be used alone or in combination of two or more thereof.

Particularly preferred alkali agents use for the developer are aqueous solutions of silicates such as sodium silicate or potassium silicate. This is because developability can be controlled by the ratio between silicon oxide $SiO_2$, which is a component of the silicates, and alkali metal oxide $M_2O$, and the concentration of the components. For example, alkali metal silicates described in JP-A No. 54-62004 and JP-B No. 57-7427 may effectively be used.

In the case where an automatic developing machine is used to perform development, it is known that a great number of PS plates can be processed, without exchanging the developer in a developing tank for a long time, by adding an aqueous solution having a higher alkali strength than that of the developer (a replenisher) to the developer. In the invention, this replenishing manner is preferably employed. Various surfactants or organic solvents may be added, as necessary, to the developer or the replenisher in order to accelerate or suppress the developing ability, or improve dispersibility of development scum or affinity of image areas of the printing plate with ink.

Preferred examples of the surfactants are the anionic, cationic, nonionic, and amphoteric surfactants. Optionally, the following may be added to the developer or the replenisher: a reducing agent such as hydroquinone, resorcin, or a sodium or potassium salt of an inorganic acid such as sulfurous acid or sulfurous hydroacid; an organic carboxylic acid; an antifoaming agent; or a hard water softener.

The printing plate developed with the above-mentioned developer and replenisher is subjected to post-treatment with washing water, a rinsing solution which contains a surfactant, or a desensitizing solution which contains gum arabic or a starch derivative. In the case where the image recording material of the invention is used for the printing plate, the post-treatment may be a combination of two or more of selected treatments.

The automatic developing machine is generally composed of a development section and a post-treatment section, and comprises a device for conveying printing plates, different treating solution tanks, and spraying devices. This machine is a machine for spraying respective treating solutions, which are pumped up, onto an exposed printing plate from spray nozzles, while conveying the printing plate horizontally. Recently, there has also been known a method of immersing and conveying the printing plate in treating solution tanks filled with treating solutions by means of in-liquid guide rolls. Such an automatic processing can be performed while supplying replenishers into the respective treating solutions, depending on the amounts to be treated, working time, and other factors. The electric conductivity is detected using a sensor such that the replenisher can be supplied automatically. The so-called disposable processing method is also used, in which respective treatments are conducted using fresh treating solutions which have not substantially been used. According to the method of the invention, there do not arise undesirable incidences that developability decreases with the passage of time by carbon dioxide gas or that printing durability is lowered due to the factors relating to the developer. Thus, the method of the invention can be preferably applied to any one of these automatic developing machines.

The planographic printing plate obtained as above may optionally be coated with a desensitizing gum, and then subjected to a printing step. In order to further enhance printing durability, the plate is subjected to burning treatment.

If burning treatment is conducted, the planographic printing plate is preferably treated with a surface-adjusting solution before the burning treatment is conducted, as described in JP-B Nos. 61-2518 and 55-28062, and JP-A Nos. 62-31859 and 61-159655.

The treating method is, for example, a method of applying the surface-adjusting solution to the planographic printing plate with a sponge or absorbent cotton impregnated with this solution, a method of immersing the printing plate in the surface-adjusting solution contained in a vat, or a method of applying the surface-adjusting solution to the printing plate using an automatic coater. If the amount of the applied solution is regulated to be uniform using a squeegee or a squeegee roller after the application thereof, a better result is given. The amount of the applied surface-adjusting solution is preferably from 0.03 to 0.8 g/$m^2$ (in terms of dry weight).

The planographic printing plate onto which the surface-adjusting solution has optionally been applied is dried, and then heated to a high temperature using a burning processor (for example, Type BP-1300 sold by Fuji Photo Film Co., Ltd.) or the like. The heating temperature and the heating time in this case are preferably from 180 to 300° C. and from 1 to 20 minutes, respectively, depending on the kinds of the components to form images.

If needed, the planographic printing plate having undergone the burning treatment may be subjected to conventionally conducted treatments, such as water-washing and gumming. However, in the case of using the surface-adjusting solution which contains a water soluble polymer compound or the like, a so-called desensitizing treatment (e.g., gumming) may be obviated.

The planographic printing plate in which the photosensitive composition of the invention is used in its image recording layer is charged in an offset printing machine or some other printing machine, and is used for printing a large number of sheets.

EXAMPLES

The present invention will now be specifically described by the following examples. However, the invention is not limited to these examples.

Examples 1 to 3, and Comparative Examples 1 and 2

Preparation of Substrate

<Aluminum Plate>

An aluminum alloy mainly containing Al and further including Si: 0.06% by mass, Fe: 0.30% by mass, Cu: 0.001% by mass, Mn: 0.001% by mass, Mg: 0.001% by mass, Zn: 0.001% by mass, Ti: 0.03% by mass, and the balance being unavoidable impurities was used to prepare a molten metal. After molten metal treatment and filtration, an ingot having a thickness of 500 mm and a width of 1,200 mm was obtained by DC casting. The surface was scraped by means of a surface scraping machine to give an average thickness of 10 mm. Thereafter, the ingot was kept at 550° C. for about 5 hours. When the temperature thereof was lowered to 400° C., a rolled plate having a thickness of 2.7 mm was formed from the ingot using a hot rolling machine. Furthermore, a continuously annealing machine was used to subject the rolled plate to thermal treatment at 500° C., and then the plate was subjected to cold rolling so as to give a thickness of 0.24 mm. In such a manner, an aluminum plate of JIS 1050 material was yielded. After this aluminum plate was worked to provide a width of 1,030 mm, the aluminum plate was subjected to the following surface treatment.

<Surface Treatment>

Surface treatment was conducted by carrying out the following treatments (a) to j) successively. After each of the treatments and water washing, liquids were removed using a nip roller.

(a) Mechanical Surface-Roughening Treatment

Using a machine shown in FIG. 1, the aluminum plate was subjected to mechanical surface-roughening treatment with rotating roller-shaped nylon brushes, while supplying a suspension of a grinding agent (pumice) in water having a specific gravity of 1.12, as a grinding slurry, onto the surface of the aluminum plate. In FIG. 1, reference number 1 indicates an aluminum plate; 2 and 4, roller-shaped brushes; 3, a grinding slurry solution; and 5, 6, 7 and 8, supporting rollers. The average particle size of the grinding agent was 30 μm, and the maximum particle size thereof was 100 μm. Each of the nylon brushes was made of 6,10-nylon having a bristle length of 45 mm and a bristle diameter of 0.3 mm. The nylon brush was produced by opening holes in a stainless steel cylinder having a diameter of (300 mm and transplanting bristles into the holes so that the bristles would be intensely grafted. The number of the used rotating brushes was three. The distance between the two supporting rollers (diameter: ϕ200 mm) below each of the brushes was 300 mm. Each of the brush rollers was pushed against the aluminum plate until a load applied to a driving motor for rotating the brush was 7 kW over the load that had been applied thereto before the brush roller was pushed against the aluminum plate. The rotating direction of the brush was the same as the moving direction of the aluminum plate. The rotating number of the brush was 200 rpm.

(b) Alkali Etching Treatment

The aluminum plate obtained as above was subjected to etching treatment by spraying an aqueous solution having a 2.6% by mass sodium hydroxide and a 6.5% by mass aluminum ions, and a temperature of 70° C., to thereby dissolve the aluminum plate by an amount of 10 $g/m^2$. Thereafter, the aluminum plate was washed by spraying water.

(c) Desmutting Treatment

The resultant aluminum plate was subjected to desmutting treatment by spraying a 1% by mass aqueous nitric acid solution (containing 0.5% by mass of aluminum ions) having a temperature of 30° C. Thereafter, the aluminum plate was washed by spraying water. The aqueous nitric acid solution used in the desmutting treatment was a used waste liquid generated in the electrochemically surface-roughening treatment conducted by applying an alternating current in aqueous nitric acid solution.

(d) Electrochemically Surface-Roughening Treatment

Figure 2:
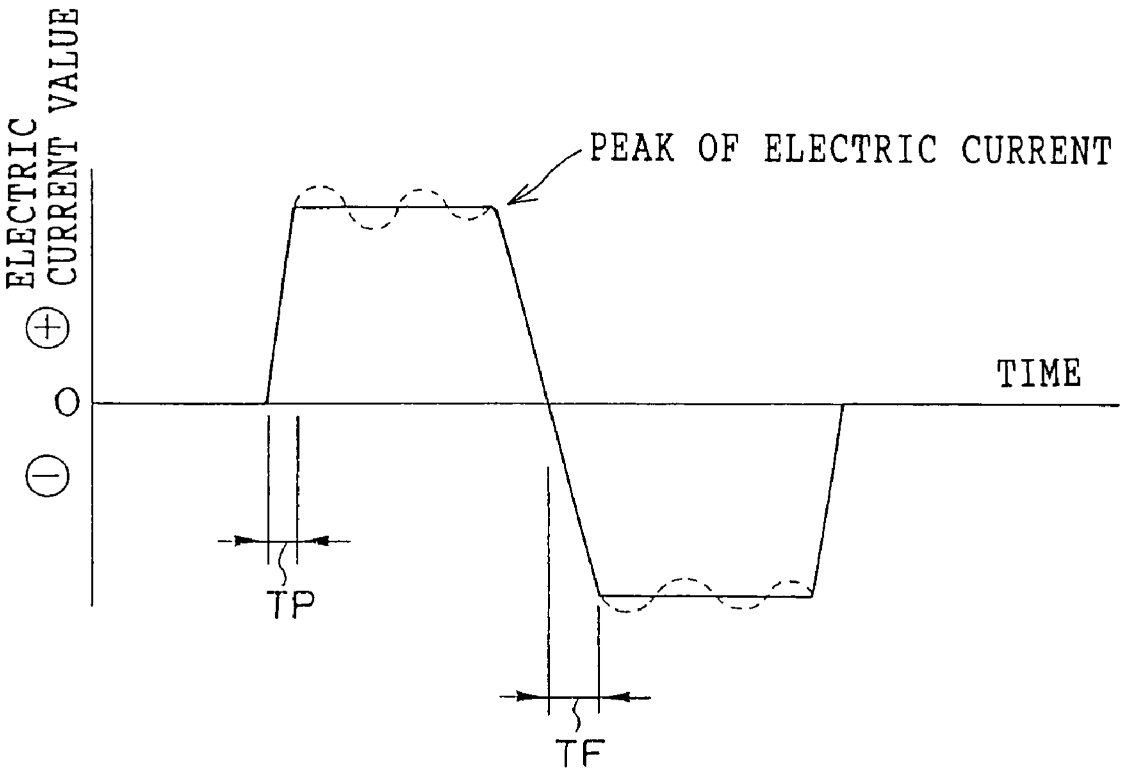
FIG. 2 is a graph illustrating an example of a chart of an alternating waveform current applied in electrochemically surface-roughening treatment when forming a substrate of a planographic printing plate according to the invention.
Figure 3:
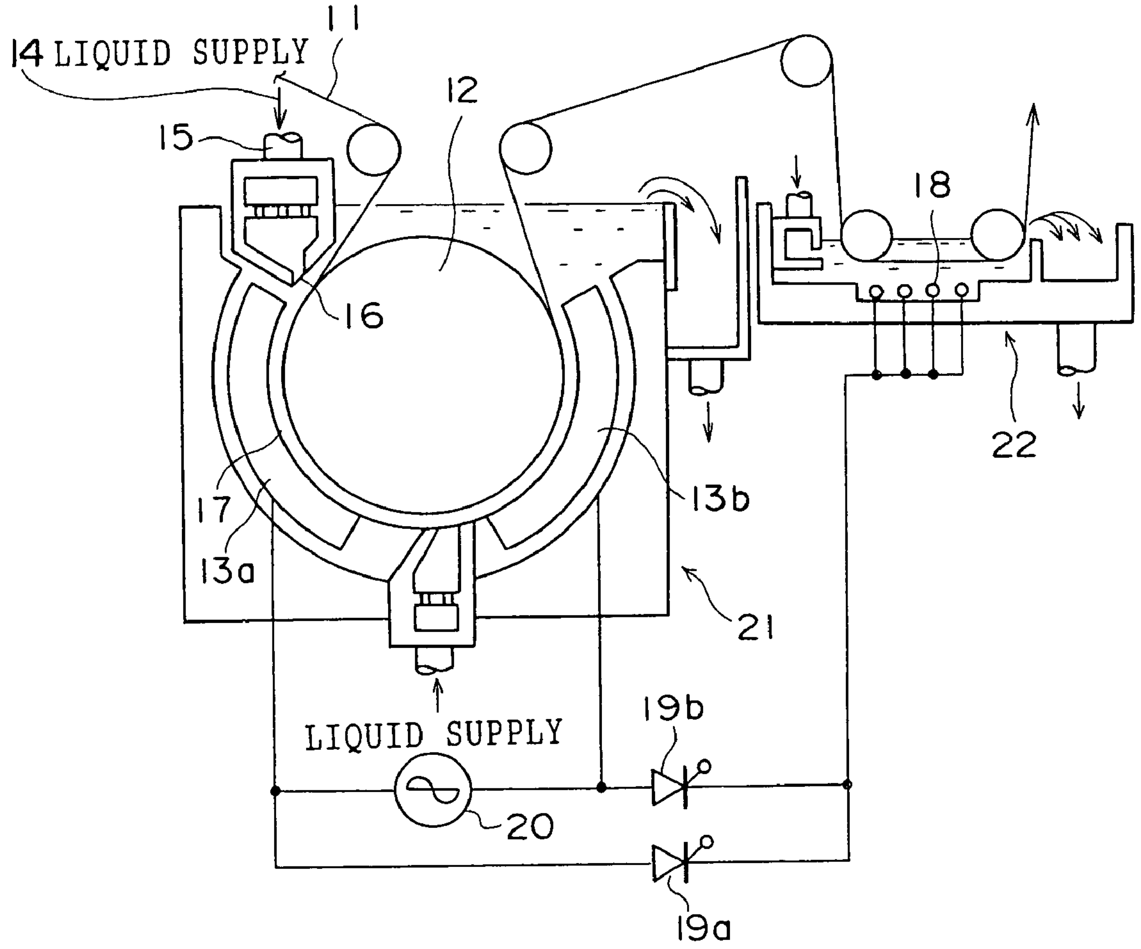
FIG. 3 is a side view illustrating an example of a radial cell which supplies an alternating current used in electrochemical surface-roughening treatment when forming a substrate of a planographic printing plate according to the invention.

An alternating voltage having a frequency of 60 Hz was applied to conduct electrochemically surface-roughening treatment continuously. An electrolyte used was a 10.5 g/L aqueous nitric acid solution (containing 5 g/L of aluminum ions and 0.007% by mass of ammonium ions) having a liquid temperature of 50° C. The waveform of the alternating current of a power source is shown in FIG. 2. The electrochemically surface-roughening treatment was performed using a trapezoidal waveform alternating current (time TP from the point when the current value was zero to the point when the current value reached a peak: 0.8 msec, and duty ratio: 1:1) and a carbon electrode as a counter electrode. As an auxiliary anode, a ferrite electrode was used. The electrolytic cell used is shown in FIG. 3.

The current density was 30 $A/dm^2$ at the peak value of the current. The total sum of electric quantities generated when the anode was an aluminum plate was 220 $C/dm^2$. 5% of the electric current flowing from the power source was divided to the auxiliary anode. Thereafter, the aluminum plate was washed by spraying water.

(e) Alkali Etching Treatment

The aluminum plate was subjected to etching treatment by spraying an aqueous solution having a 26% by mass of sodium hydroxide and 6.5% by mass of aluminum ions at 32° C., to thereby dissolve the aluminum plate by an amount of 0.50 $g/m^2$. The smutting components, which were made mainly of aluminum hydroxide and generated when the alternating current was applied to conduct the electrochemical surface-roughening treatment, were removed. Further, the edge portions of generated pits were dissolved to make the edge portions smooth. Thereafter, the aluminum plate was washed by spraying water.

(f) Desmutting Treatment

The aluminum plate was subjected to desmutting treatment by spraying a 15% by mass aqueous sulfuric acid solution (containing 4.5% by mass of aluminum ions) having a temperature of 30° C. Thereafter, the aluminum plate was washed by spraying water. The aqueous nitric acid solution used in the desmutting treatment was a used waste liquid generated in the electrochemically surface-roughening treatment conducted by applying an alternating current in aqueous nitric acid solution.

(g) Electrochemically Surface-Roughening Treatment

An alternating voltage having a frequency of 60 Hz was applied to conduct electrochemically surface-roughening treatment continuously. An electrolyte used was a 5.0 g/L aqueous hydrochloric acid solution (containing 5 g/L of aluminum ions) having a temperature of 35° C. The waveform of the alternating current of a power source is shown in FIG. 2. The electrochemically surface-roughening treatment was performed using the trapezoidal waveform alternating current (time TP from the point when the current value was zero to the point when the current value reached a peak: 0.8 msec, and duty ratio: 1:1) and a carbon electrode as a counter electrode. As an auxiliary anode, a ferrite electrode was used. The electrolytic cell used is shown in FIG. 3.

In FIG. 3, reference number 11 indicates an aluminum plate; 12, a radial drum roller; 13*a* and 13*b*, main electrodes; 14, an electrolyte; 15, an electrolyte supplying port; 16, a slit; 17, an electrolyte passage; 18, an auxiliary electrode; 19*a* and 19*b*, thyristors; and 20, an alternating current power source.

The current density was 25 $A/dm^2$ at the peak value of the current. The total sum of electric quantities generated when the anode was an aluminum plate was 50 $C/dm^2$. Thereafter, the aluminum plate was washed by spraying water.

(h) Alkali Etching Treatment

The resultant aluminum plate was subjected to etching treatment by spraying an aqueous solution having 26% by mass of sodium hydroxide and 6.5% by mass of aluminum ions at 32° C., to thereby dissolve the aluminum plate by an amount of 0.10 $g/m^2$. The smutting components, which were mainly of aluminum hydroxide and generated when the above-mentioned alternating current was applied to conduct the electrochemical surface-roughening treatment, were removed. Further, the edge portions of generated pits were dissolved to make the edge portions smooth. Thereafter, the aluminum plate was washed by spraying water.

(i) Desmutting Treatment

The aluminum plate was subjected to desmutting treatment by spraying a 25% by mass aqueous sulfuric acid solution (containing 0.5% by mass of aluminum ions) having a temperature of 60° C. Thereafter, the aluminum plate was washed by spraying water.

(j) Anodizing Treatment

Figure 4:
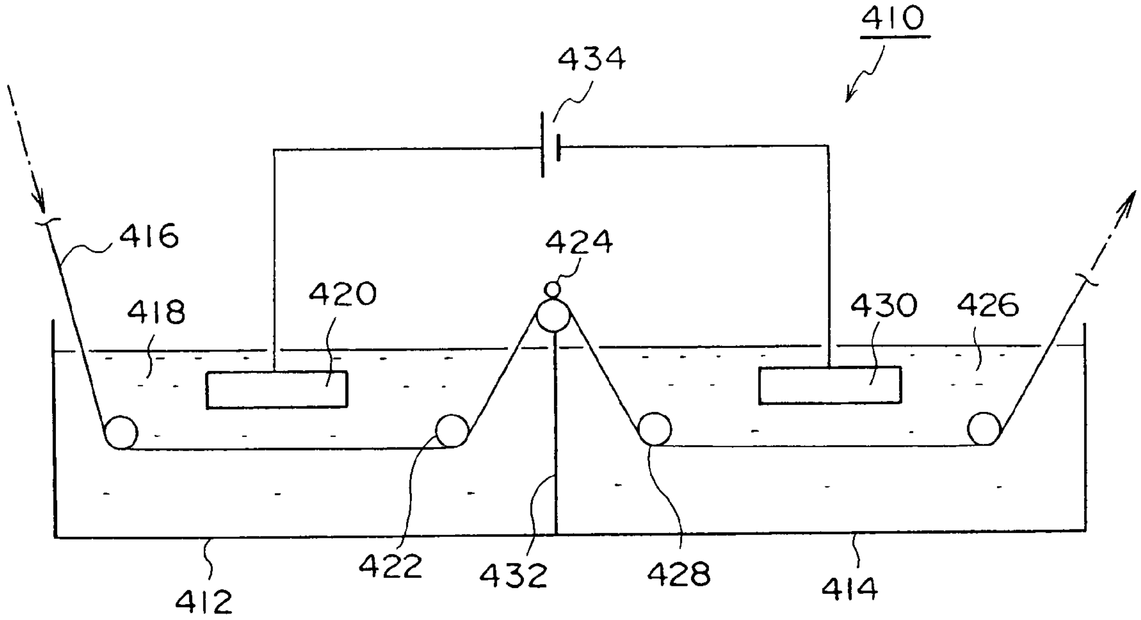
FIG. 4 is a schematic view of an anodizing device used in anodizing treatment when forming a substrate of a planographic printing plate according to the invention.

Using an anodizing machine illustrated in FIG. 4, anodizing treatment was performed to thereby yield a substrate for a planographic printing plate. Each of electrolytes supplied to a first and a second electrolyzing section was sulfuric acid. Each of the electrolytes had a sulfuric acid concentration of 170 g/L (and contained 0.5% by mass of aluminum ions) and had a temperature of 38° C. Thereafter, the aluminum plate was washed by spraying water. The final amount of the oxide film coated was 2.7 g/m$^2$.

In FIG. 4, reference number 50 indicates an auxiliary anode tank; 410, an anodizing device; 412, a power supplying tank; 414, an electrolytic cell; 416, an aluminum plate; 418 and 426, electrolytes; 420, power supplying electrode; 422 and 428, rollers; 424, a nip roller; 430, an electrolytic electrode; 432, a cell wall; and 434, a direct current power source.

Undercoat

Next, the following undercoating solution was applied to this aluminum substrate using a wire bar. A hot-air drying machine was used to dry the substrate at 90° C. for 30 seconds. The amount of the undercoat after dried was 10 mg/m$^2$.

| <Undercoat Solution> | |
|---|---|
| copolymer of ethyl acrylate and a sodium 2-acrylamide-2-methyl-l-propane sulfonate (molar ratio: 75:15) | 0.1 g |
| 2-aminoethylphosphonic acid | 0.1 g |
| methanol | 50 g |
| ion exchange water | 50 g |

Photosensitive Layer

Then, the following coating solution for the photosensitive layer [P-1] was prepared and applied to the aluminum plate having the undercoat using a wire bar. The aluminum plate was put in a hot-air drying machine to dry the applied solution at 125° C. for 27 seconds, to thereby yield a planographic printing plate precursor. The amount of the coated film after dried was within a range of 1.2 to 1.3 g/m$^2$, and the contact angle to water was 92°. The kinetic friction coefficient against a sapphire stylus (R: 1 mm) was 0.14.

| <Coating Solution for Photosensitive Layer [P-1]> | |
|---|---|
| infrared absorber (IR-1) | 0.08 g |
| polymerization initiator (OS-1) | 0.34 g |
| dipentaerythritol hexaacrylate | 1.00 g |
| binder shown in Table 1 | 1.00 g |
| chloride salt of Ethyl Violet | 0.04 g |
| fluorine-type surfactant (W-1) | 0.03 g |
| stearoylmethylamide | 0.06 g |
| methyl ethyl ketone | 14 g |
| methanol | 6.5 g |
| 1-methoxy-2-propanol | 14 g |

The structures each of the infrared absorber (IR-1), the polymerization initiator (OS-1), and the fluorine-type surfactant (W-1) used in the coating solution for the photosensitive layer, and binders (comparative compounds 1 and 2) used in Comparative Examples are shown below.

InFared Absorber (IR-1)

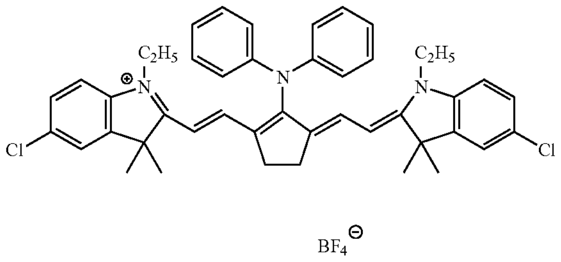

Polymerization Initiator (OS-1)

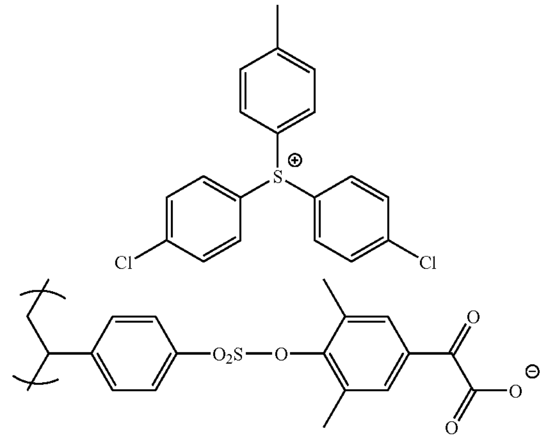

Fluorine-type Surfactant (W-1)

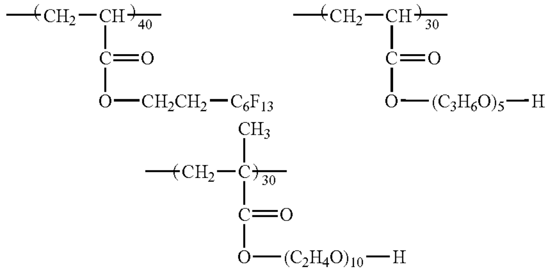

Binders

1

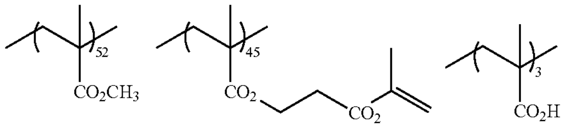

2

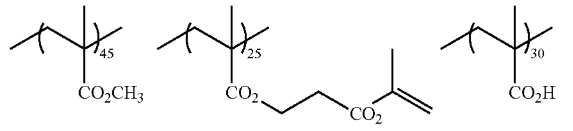

Evaluation

<Exposure>

The obtained negative-type planographic printing plate precursor was imagewise exposed to light (resolution: 1751 dpi) by means of a Trendsetter 3244VFS manufactured by Creo Co., under the following conditions: power output: 9

W, the rotating number of an outside-surface drum: 210 rpm, printing plate energy: 100 mJ/$cm^2$, and resolution: 2400 dpi.

<Measurement of Acid Value of Film>

The acid value of the photosensitive layer (film) in this Example was measured as follows. On the basis of the masses of the respective compounds (binder polymers) having an acidic group in the coating solution for the photosensitive layer, and the acidic values of the respective compounds having an acidic group in the photosensitive layer, the acid value of the film was obtained from a calculated value obtained by dividing "a sum of respective masses of the compounds having an acidic group multiplied by respective acid values thereof" by "a mass of solids present in the film". The acid value of each of the compounds having an acidic group was obtained as follows: a mixture of this compound, MFG and water was prepared in such a manner that the amount of MFG and the amount of water were made to 54 ml and 6 ml, respectively, relative to 0.1 g of this compound; a burette was used to neutralization-titrate this mixture with a 0.1 N aqueous NaOH solution to obtain, as the acid value, the mole number of NaOH necessary for the neutralization of 1 g of the compound. For pH measurement, a pH meter (HM-26S) manufactured DKK-TOA Corporation was used. The results are also shown in Table 1 below.

<Developing Treatment>

After the exposure, development was conducted using an automatic developing machine LP940H, manufactured by Fuji Photo Film Co., Ltd., at 30° C. for 20 seconds. The used developer was a solution obtained by diluting DV-2, manufactured by Fuji Photo Film Co., Ltd., with water (DV-2: water=1:4). The used finisher was a solution obtained by diluting FP-2W, manufactured by Fuji Photo Film Co., Ltd., with water (FP-2W: water=1:1).

(1) Printing Performance

The obtained planographic printing plate was subjected to printing using a printer LITHRON (manufactured by Komori Corp.). Stains at non-image areas and printing durability were evaluated. The results are shown in Table 1.

TABLE 1

| | Binder | Acid value of Film | Stains at Non-Image Areas | Printing Durability |
|---|---|---|---|---|
| Comparative Example 1 | Comparative Compound 1 | 0.1 | Observed | 100,000 sheets |
| Example 1 | I-1 | 0.24 | Not observed | 100,000 sheets |
| Example 2 | I-5 | 0.35 | Not observed | 100,000 sheets |
| Example 3 | I-7 | 0.62 | Not observed | 100,000 sheets |
| Comparative Example 2 | Comparative Compound 2 | 1 | Not observed | 30,000 sheets |

As is evident from Table 1, the planographic printing plate precursors of Examples 1 to 3 according to the invention, which had an acid value of 0.15 mmol/g or more and 0.8 mmol/g or less, had no stains at non-image areas at the time of the printing, and were superior in printing durability. On the other hand, the planographic printing plate precursors of Comparative Examples 1 and 2 prepared using the binder polymers of the comparative compounds 1 and 2, which had no specific carboxylic acid group as an alkali soluble group and were different from Examples 1 to 3 in the amount of the introduced alkali-soluble structural unit, yielded poor results. That is, in Comparative Example 1 having the acid value which was too low, stains occurred at non-image areas, and in Comparative Example 2 having the acid value which was too high, printing durability was significantly low.

As detailed above, the present invention provides the infrared photosensitive composition that is highly curable by an infrared laser, useful as a recording layer for a negative-type planographic printing plate precursor on which images can be recorded directly from digital data stored in a computer or the like, excellent in both printing durability and stain resistance at non-image areas when applied to planographic printing plate precursors, and can form high-quality images.

What is claimed is:

1. An infrared photosensitive composition, comprising:

a binder polymer (A), a polymerizable compound (B), an infrared absorber (C), and a compound (D) which can generate radicals by the action of light or heat, wherein an acid value of a film produced from the composition is from 0.15 mmol/g to 0.8 mmol/g, and wherein the binder polymer (A) has a structural unit represented by the following formula (I):

Formula (I)

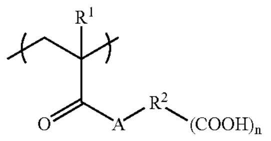

wherein $R^1$ represents a hydrogen atom or a methyl group; $R^2$ represents a linking group having 4 to 30 atoms selected from carbon, hydrogen, oxygen, nitrogen, sulfur and halogen; A represents an oxygen atom or —N—$R^3$—, in which $R^3$ represents a hydrogen atom or a monovalent hydrocarbon group having 1 to 10 carbon atoms; and n represents an integer of 1 to 3.

2. The infrared photosensitive composition according to claim 1, wherein the binder polymer (A) is a polymer having a radical polymerizable group.

3. The infrared photosensitive composition according to claim 1, wherein the content of the radical polymerizable group in the binder polymer (A) is from 0.1 to 10.0 mmol per gram of the polymer.

4. The infrared photosensitive composition according to claim 1, wherein the binder polymer (A) is a linear organic polymer having an alkali soluble group.

5. The infrared photosensitive composition according to claim 1, wherein the binder polymer (A) has a glass transition point (Tg) of 70 to 300° C.

6. The infrared photosensitive composition according to claim 1, wherein the binder polymer (A) is contained in a proportion of 20 to 95% by mass relative to total solid contents in the infrared photosensitive composition.

7. The infrared photosensitive composition according to claim 1, wherein the polymerizable compound (B) has at least one ethylenically unsaturated double bond.

8. The infrared photosensitive composition according to claim 1, wherein the polymerizable compound (B) is an ester made from an unsaturated carboxylic acid and an aliphatic polyhydric alcohol compound, or is an amide made from an unsaturated carboxylic acid and an aliphatic polyhydric amine compound.

9. The infrared photosensitive composition according to claim 8, wherein the polymerizable compound (B) (i) is the ester made from the unsaturated carboxylic acid and the aliphatic polyhydric alcohol compound and (ii) is selected from the group consisting of acrylic esters, methacrylic esters, itaconic esters, crotonic esters, isocrotonic esters, and maleic esters.

10. The infrared photosensitive composition according to claim 8, wherein the polymerizable compound (B) (i) is the amide made from the unsaturated carboxylic acid and the aliphatic polyhydric amine compound and (ii) is selected from the group consisting of methylenebis-acrylamide, methylenebis-methacrylamide, 1,6-hexamethylenebisacrylamide, 1,6-hexamethylenebis-methacrylamide, diethylenetriaminetrisacrylamide, xylenebisacrylamide, and xylenebismethacrylamide.

11. The infrared photosensitive composition according to claim 7, wherein the polymerizable compound (B) is contained in a proportion of 5 to 80% by mass relative to all components in the infrared photosensitive composition.

12. The infrared photosensitive composition according to claim 1, wherein the infrared absorber (C) is a dye or a pigment having an absorption maximum within the range of wavelengths of 760 to 1,200 nm.

13. The infrared photosensitive composition according to claim 12, wherein the dye is selected from the group consisting of azo dyes, metal complex salt azo dyes, pyrazolone dyes, naphthoquinone dyes, anthraquinone dyes, phthalocyanine dyes, carbonium dyes, quinoneimine dyes, methane dyes, cyanine dyes, squarylium dyes, pyrylium salts, and metal thiolate complex dyes.

14. The infrared photosensitive composition according to claim 1, wherein the binder polymer (A) has a meth(acryloyl) group as a side chain.

15. The infrared photosensitive composition according to claim 1, wherein the binder polymer (A) has at least one of an amide group or an imide group.

16. The infrared photosensitive composition according to claim 1, wherein the compound (D) which can generate radicals by the action of light or heat is an onium salt selected from the group consisting of iodonium salts, diazonium salts and sulfonium salts.

17. The infrared photosensitive composition according to claim 16, wherein the maximum absorption wavelength of the onium salt is 400 nm or less.

18. The infrared photosensitive composition according to claim 16, wherein the onium salt is contained in a proportion of 0.1 to 50% by mass relative to total solid contents in the infrared photosensitive composition.

19. A planographic printing plate precursor comprising a substrate having disposed thereon a recording layer that contains an infrared photosensitive composition including: a binder polymer (A), a polymerizable compound (B), an infrared absorber (C), and a compound (D) which can generate radicals by the action of light or heat, wherein an acid value of a film produced from the composition is from 0.15 mmol/g to 0.8 mmol/g, and wherein the binder polymer (A) has a structural unit represented by the following formula (I):

Formula (I)

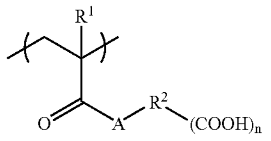

wherein $R^1$ represents a hydrogen atom or a methyl group; $R^2$ represents a linking group having 4 to 30 atoms selected from carbon, hydrogen, oxygen, nitrogen, sulfur and halogen; A represents an oxygen atom or $—N—R^3—$, in which $R^3$ represents a hydrogen atom or a monovalent hydrocarbon group having 1 to 10 carbon atoms; and n represents an integer of 1 to 3.

20. The planographic printing plate precursor according to claim 19, wherein the binder polymer (A) has a meth(acryloyl) group as a side chain.

* * * * *